US008085531B2

(12) United States Patent
Lemak et al.

(10) Patent No.: US 8,085,531 B2
(45) Date of Patent: Dec. 27, 2011

(54) ANISOTROPIC THERMAL CONDUCTION ELEMENT AND MANUFACTURING METHOD

(75) Inventors: Richard J. Lemak, Allentown, PA (US); Robert J. Moskaitis, Easton, PA (US); David Pickrell, State College, PA (US)

(73) Assignee: Specialty Minerals (Michigan) Inc., Bingham Farms, MI (US)

( * ) Notice: Subject to any disclaimer, the term of this patent is extended or adjusted under 35 U.S.C. 154(b) by 0 days.

(21) Appl. No.: 12/502,561

(22) Filed: Jul. 14, 2009

(65) Prior Publication Data

US 2011/0014417 A1    Jan. 20, 2011

(51) Int. Cl.
H05K 7/20    (2006.01)

(52) U.S. Cl. .......... 361/679.54; 361/703; 361/704; 361/708; 361/718; 428/408; 257/712; 257/720; 165/185

(58) Field of Classification Search .......... 361/679.46, 361/679.54, 701–713, 718–720, 746, 751, 361/757, 761, 762; 165/80.3, 104.33, 135, 165/170, 185; 257/706, 707, 713, 717–721, 257/722, 727; 428/408, 32.69, 322.7, 375, 428/448, 112, 378, 593, 614, 295.4, 209, 428/339; 438/106, 122, 690, 692, 135; 156/114, 156/325, 326; 29/411, 412, 417, 428, 890.03, 29/890.039; 423/447.2, 448
See application file for complete search history.

(56) References Cited

U.S. PATENT DOCUMENTS

| | | | |
|---|---|---|---|
| 4,810,563 A * | 3/1989 | DeGree et al. ............ | 428/209 |
| 5,255,738 A * | 10/1993 | Przilas ............... | 165/185 |
| 5,296,310 A * | 3/1994 | Kibler et al. ............ | 428/614 |
| 5,494,753 A * | 2/1996 | Anthony ............... | 428/408 |
| 5,542,471 A * | 8/1996 | Dickinson ............ | 165/170 |
| 5,769,158 A * | 6/1998 | Yao ............... | 165/185 |
| 5,844,310 A * | 12/1998 | Okikawa et al. ............ | 257/712 |
| 5,949,650 A * | 9/1999 | Bulante et al. ............ | 361/704 |
| 5,958,572 A * | 9/1999 | Schmidt et al. ............ | 428/320.2 |
| 6,027,807 A * | 2/2000 | Inoue et al. ............ | 428/408 |
| 6,060,166 A * | 5/2000 | Hoover et al. ............ | 428/408 |
| 6,075,701 A * | 6/2000 | Ali et al. ............ | 361/704 |
| 6,131,651 A * | 10/2000 | Richey, III ............ | 165/185 |
| 6,407,922 B1 * | 6/2002 | Eckblad et al. ............ | 361/704 |
| 6,469,381 B1 * | 10/2002 | Houle et al. ............ | 257/707 |
| 6,771,502 B2 * | 8/2004 | Getz et al. ............ | 361/703 |

(Continued)

OTHER PUBLICATIONS

International Search Report dated Aug. 19, 2010 for corresponding PCT Application No. PCT/US2010/039949.

Primary Examiner — Michail V Datskovskiy
(74) Attorney, Agent, or Firm — Derek S. Jessen; Lion Nigohosian, Jr.

(57) ABSTRACT

An anisotropic thermal conductive element that can conduct heat from a thermal source with high efficiency in the thickness direction which maintaining strength and a method of making the element. To achieve the above, an anisotropic thermal conductive element that can conduct heat from a heat source, a structure with a stack of graphite sheets having a contact surface across the thickness direction of the graphite sheets, and the stack of graphite sheets has the surroundings thereof coated to form a support parts. The coating process covers the structure of stacked graphite with a support part. A cutting process can be performed by cutting along the surface in the stacking direction after the coating process. After the cutting process, a surface treatment process can make a surface treatment to a section.

11 Claims, 8 Drawing Sheets

U.S. PATENT DOCUMENTS

| | | | |
|---|---|---|---|
| 6,777,086 B2 * | 8/2004 | Norley et al. | 428/408 |
| 6,837,306 B2 * | 1/2005 | Houle et al. | 165/185 |
| 6,841,250 B2 * | 1/2005 | Tzeng | 428/408 |
| 6,844,054 B2 * | 1/2005 | Whatley | 428/295.4 |
| 6,898,084 B2 | 5/2005 | Misra | |
| 7,195,951 B2 * | 3/2007 | Houle et al. | 438/106 |
| 7,220,485 B2 * | 5/2007 | Sayir et al. | 428/408 |
| 7,228,894 B2 * | 6/2007 | Moore et al. | 165/185 |
| 7,252,795 B2 * | 8/2007 | Ozaki et al. | 264/29.7 |
| 7,292,440 B2 * | 11/2007 | Cho et al. | 361/704 |
| 7,297,399 B2 * | 11/2007 | Zhang et al. | 428/339 |
| 7,303,005 B2 | 12/2007 | Reis et al. | |
| 7,351,360 B2 * | 4/2008 | Hougham et al. | 252/502 |
| 7,402,340 B2 * | 7/2008 | Ozaki et al. | 428/408 |
| 7,672,134 B2 * | 3/2010 | Wayman | 361/704 |
| 7,760,507 B2 * | 7/2010 | Jewram et al. | 361/713 |
| 7,797,808 B2 * | 9/2010 | Zhang et al. | 29/458 |
| 7,808,787 B2 * | 10/2010 | Lemak et al. | 361/708 |
| 7,859,848 B1 * | 12/2010 | Lemak et al. | 361/708 |
| 2002/0021997 A1 * | 2/2002 | Taomoto et al. | 423/448 |
| 2007/0030653 A1 * | 2/2007 | Norley et al. | 361/704 |
| 2007/0053168 A1 * | 3/2007 | Sayir et al. | 361/718 |
| 2007/0063339 A1 * | 3/2007 | Yao | 257/720 |
| 2008/0008216 A1 * | 1/2008 | Miller et al. | 372/36 |
| 2008/0128067 A1 * | 6/2008 | Sayir et al. | 156/60 |
| 2008/0274358 A1 * | 11/2008 | Spacie et al. | 428/408 |
| 2009/0067132 A1 | 3/2009 | Lemak et al. | |
| 2009/0095461 A1 | 4/2009 | Lemak et al. | |
| 2011/0030940 A1 * | 2/2011 | Takeda | 165/185 |

* cited by examiner

放熱

(a)

(b)

(c)

ANISOTROPIC THERMAL CONDUCTION ELEMENT AND MANUFACTURING METHOD

BACKGROUND

The present invention relates to a heat spreader for conducting heat from a device and a method of making the heat spreader. Electronic components are becoming smaller while heat dissipation requirements are becoming greater. In order to dissipate heat generated by these electronic components, heat spreaders are utilized between the electronic component and a heat sink. Heat spreaders can be made of a solid thermally conductive metal. The solid conductive metal has a limited ability to spread heat and has limited thermal conductivity characteristics. Graphite sheets which contain benzene rings are connected by covalent bonds having a stacked crystal structure, and the graphite layers are connected by van der Waals forces. The graphite sheets as a part of a thermal conduction element are used to reduce of hotspot occurring with electronics and electronic devices. The thermal conduction element can conduct heat from the source of heat to radiate beat efficiently.

To use as a heat conduction element, it was necessary to mechanically contact the source of heat closely, but there was concern of damaged due to stress of a machine by contact with the source of heat and clamping with installation parts because graphite generally has the property of being fragile and easy to collapse. The graphite can be coated on the surface with resin or aluminum or PET, but there was usually a problem that the thermal conduction efficiency would suffer if thickness of a coating part is large.

Japanese Patent No. 2008-28283 suggests that embedded metal in a piece of graphite, a thermal conduction element is formed wherein a part receives heat from the source of heat which contacts the metal.

SUMMARY

This invention relates to an anisotropic thermal conduction element and a method of manufacturing the same.

When graphite was arranged between a heat source and the radiation of heat elements such as radiation of heat fins, resin materials of silicone and epoxy group were used for each conductive layer as adhesives, but the thermal resistance due to the adhesive became a problem.

This invention relates to a manufacturing method with an anisotropic thermal conduction element that conducts heat from a thermal source efficiently in the thickness direction.

The structure of the anisotropic heat conduction element of this invention is an anisotropic thermal conduction element that can conduct heat from heat source. This structure is stacked graphite sheets having a relatively high thermal conductivity in the thickness direction and another direction in the plane formed by the stacked sheets and having a relatively low thermal conductivity in another direction of the plane formed by the stacked sheets. At least two of the stacked sheets contact the thermal source, and the structure formed by the at least two stacked sheets is at least partially coated forming a support part of the anisotropic thermal conduction element.

According to the above-mentioned structure, the structure consists of stacking graphite sheets having a high thermal conductivity in a direction of a plane of at least two graphite sheets and in the thickness direction of the anisotropic heat conduction element to conduct the heat of the heat source effectively. The anisotropic heat conduction element can have a relatively low thermal conductivity in the stacking direction of the anisotropic heat conduction element. Also the structure is at least partially surrounded by a coating. The coating forms the support part. Therefore, damage by the stress of the machine from clamping is avoided in the contact between the heat source and installation part.

In another embodiment, there is a metal layer is formed at the contact surface with the heat source. The anisotropic heat conduction element will be able to connect to the heat source by soldering to the metal layer easily.

In another embodiment, there is a ceramic layer formed at the contact surface with the heat source. The anisotropic heat conduction element will be able to conduct heat effectively from the heat source and insulate the anisotropic heat conduction element from undesired electrical conduction.

In another embodiment the mechanical strength of the anisotropic heat conduction element is improved by impregnating the structure with resin.

In another embodiment heat conduction efficiency is increased significantly by using highly oriented pyrolytic graphite as the stacked graphite sheets thereby having thermal conductance higher than normal graphite.

In another embodiment heat conduction efficiency is increased significantly by using highly oriented pyrolytic graphite as the stacked graphite sheets in the anisotropic heat conduction element thereby giving a thermal conductance of more than 1,500 W/mK by using a highly oriented pyrolytic graphite which can be achieved by the product with a brand name PYROID® HT made by MINTEQ International Inc. of New York, N.Y.

In another embodiment, the anisotropic heat conduction element has an installation part or installation means which permits the heat source to be installed adjacent the support part, and fixes a heat source without causing damage to the structure body by establishing the installation part which can be in the supporting part.

In another embodiment, the anisotropic heat conduction element can be in combination with an electric or electronic device.

The anisotropic heat conduction element can be made by a manufacturing method wherein a coating process covers the structure formed by the stacked graphite sheets and forms a support part or parts. A cutting process cuts across the stacking direction after the coating process, and after the cutting process, a surface treatment process can be carried out.

In another embodiment the method of manufacturing includes an impregnation step for impregnating resin to the above structure before the above mentioned coating process. The impregnation step can further improve the mechanical strength of the anisotropic heat conduction element by impregnating resin to the structure.

In another embodiment many structures are stacked in the stacking direction and coated thereby forming a support part or parts as a unit and produces an anisotropic thermal conduction element having a large contact area with the transmission of heat by the stacking of many structures further along by stacking direction.

According to this invention, a method of manufacturing an anisotropic thermal conduction element is disclosed and an anisotropic thermal conduction element that can conduct heat from a thermal source efficiently in the thickness direction and maintain strength.

DETAILED DESCRIPTION OF THE INVENTION

The invention will now be described in detail by reference to the following specification and non-limiting examples.

Without further elaboration, it is believed that one skilled in the art can, using the preceding description, utilize the present invention to its fullest extent. The following embodiments are, therefore, to be construed as merely illustrative, and not limitative of the remainder of the disclosure in any way whatsoever.

Below is an explanation of an anisotropic thermal conduction element and the manufacturing method by this invention.

Figure 1:
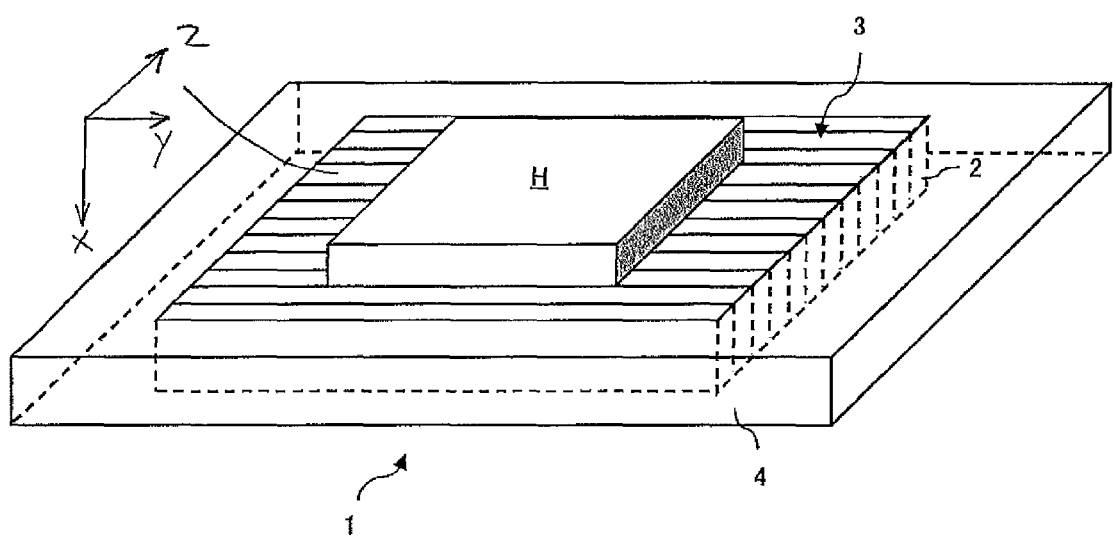
FIG. 1 shows an embodiment of an anisotropic thermal conduction element of the present invention.

As seen in FIG. 1, an anisotropic thermal conductive element 1 can conduct heat from heat source H. A structure 3 of stacked graphite sheets forms a layer along or opposed to the surface on thermal source, and the structure 3 is coated on its surroundings by support part 4.

Figure 2:
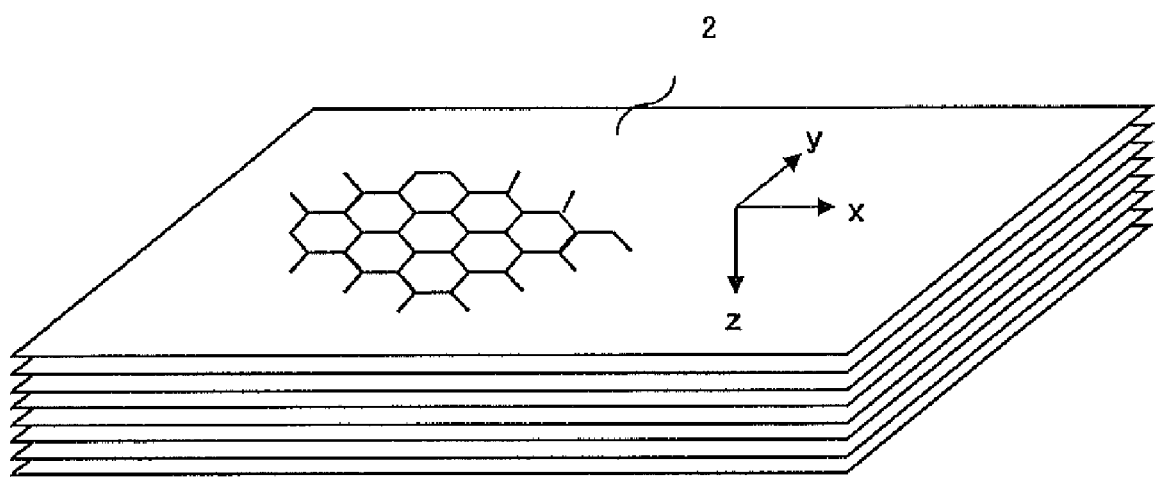
FIG. 2 shows an example of the structure of a graphite sheet.

As seen in FIG. 2, the graphite sheet 2 consists of a thickness from 0.25 mm to 20 mm and up to a size of the 300 mm in both lateral dimensions or in the form of a square. The graphite sheet 2 has hexagonal covalent bonds in a stacked crystal structure, and the graphite layers of each graphite sheet 2 are connected by van der Waals forces. The graphite sheet 2 has a thermal conductivity in the X-Y plane of the graphite sheet 2 of a value greater than in the thickness direction, i.e. the Z direction.

Figure 3:
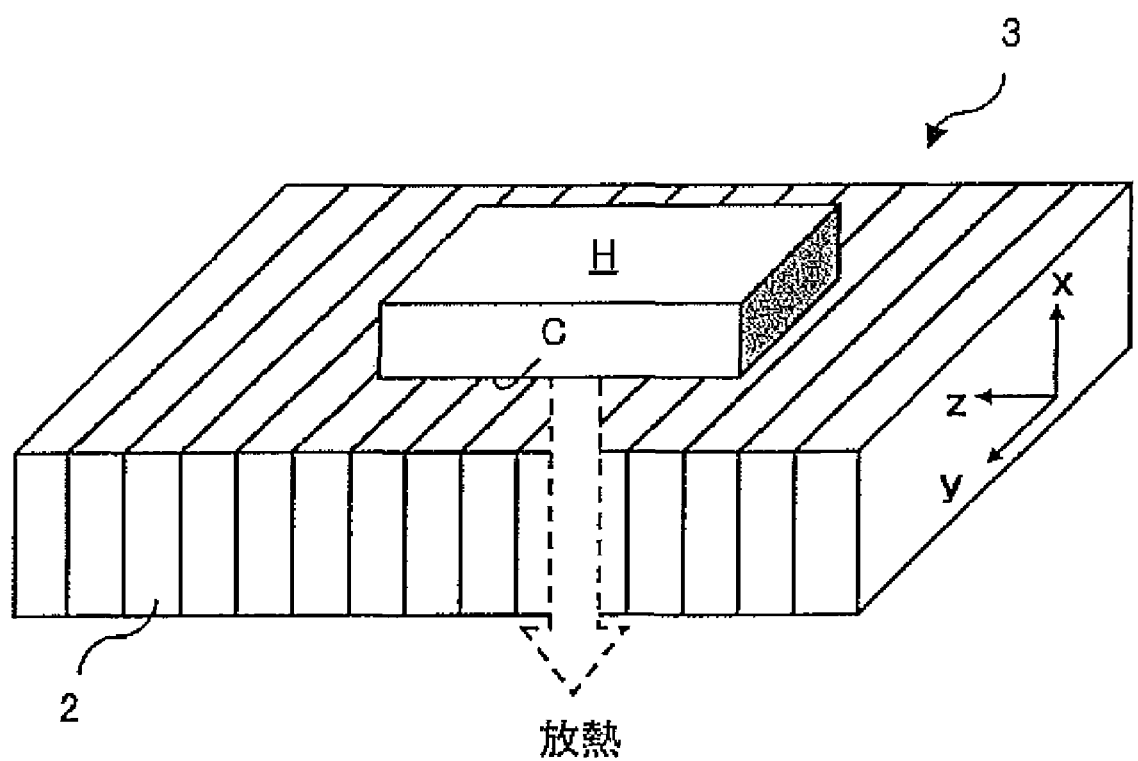
FIG. 3 shows the thermal conduction direction of the anisotropic thermal conduction element of the present invention.
Figure 5:
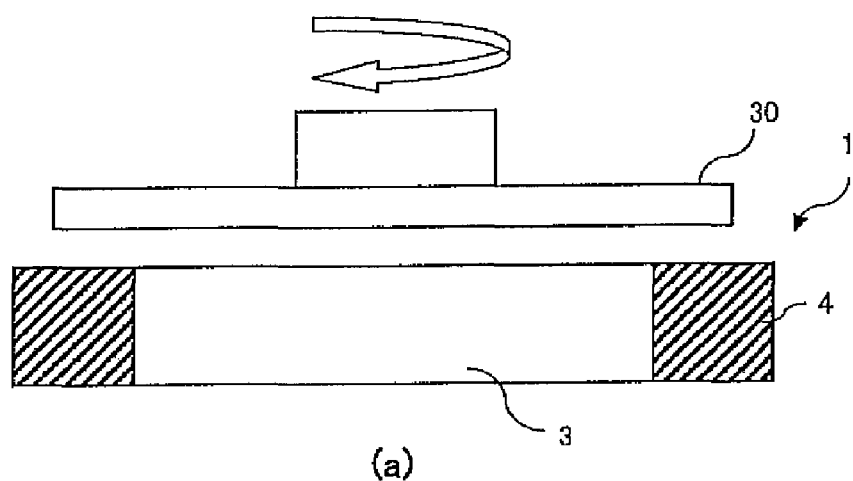
FIG. 5 shows an embodiment of the manufacturing method of the anisotropic thermal conduction element of the present invention.
Figure 5:
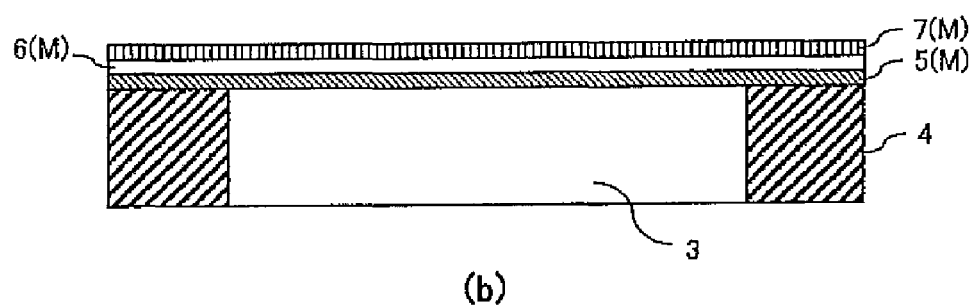
Figure 5:
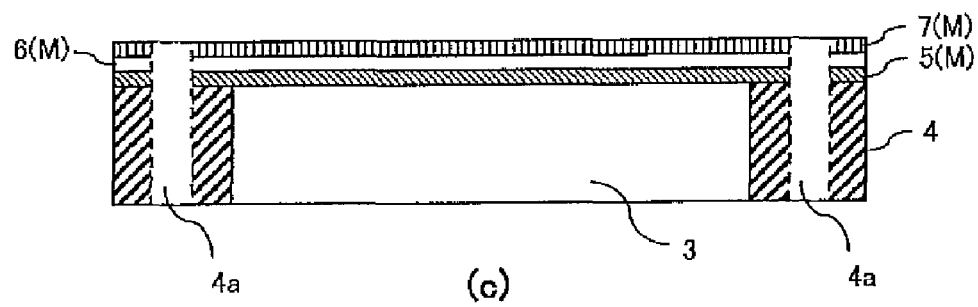

As seen in FIG. 3, the X-Y plane of graphite sheet 2 of structure 3 can be part of an anisotropic thermal conduction element 1 seen in FIG. 5, which utilizes the high thermal conductivity in the X-Y plane by arranging with a contact surface C seen in FIG. 3 with a heat source H. The X-Y plane of the graphite sheets 2 can be at an intersection and effectively perpendicular or at an angle which is other than parallel to the contact plane of contact with the heat source, and can conduct heat in the thickness direction of structure 3 efficiently.

Figure 4:
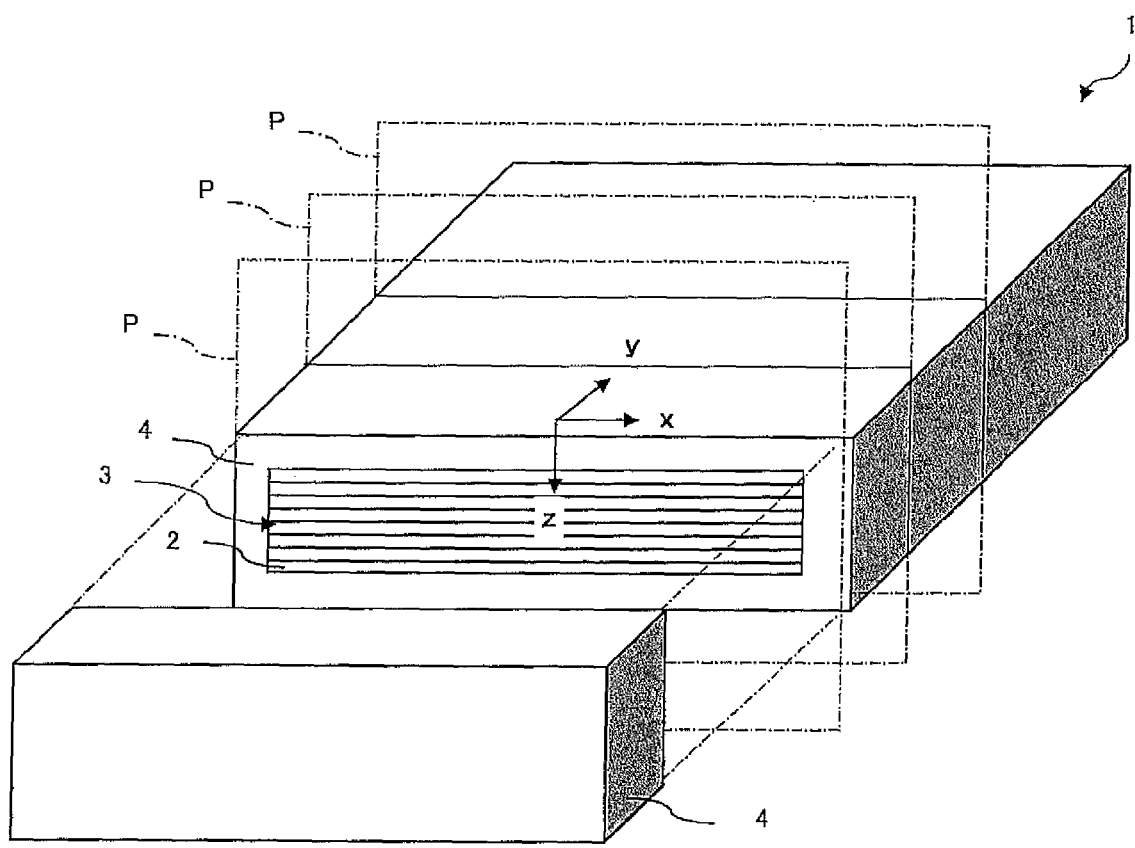
FIG. 4 shows an embodiment of the manufacturing method of the anisotropic thermal conduction element of the present invention.

Shown in FIG. 4 is another embodiment of the anisotropic thermal conduction element 1 of the present invention. The manufacturing method of making an anisotropic thermal conduction element of the present invention is described by way of making reference to FIG. 4. The method includes a coating process step of covering at least a portion of the structure 3 of stacked graphite sheets 2 thus forming support parts 4 and then a cutting process step of cutting across the stacking direction after the coating process. Optionally, after the cutting process, a surface treatment process step can be carried out to make a surface treatment to a section of structure 3 or support part 4.

Resin forming support part 4 coats the surface of structure 3 such that the coating becomes from a 0.5 mm to a 12 mm thickness by the coating process not including the graphite thickness. With diamond cutters, it can be processed by cutting with appointed intervals or units set to from about 0.5 mm to 12 mm along planes P as seen in FIG. 4 which are substantially perpendicular to an X-Y plane of graphite sheets 2 after resin solidified by the cutting process. As a result, as shown in FIG. 1, an anisotropic thermal conduction element 1 is provided.

A thermosetting resin such as phenol-based resin, a fluorinate-based resin, an epoxy-based resin, polyimide-based resin, or silicone-based resin is suitable. Structure 3 is fixed in the appointed position in the molding, and can coat the surface of structure 3 by resin by adding a setting agent in thermosetting resin and making a heat treatment and it is chosen in consideration for heat-resistant temperature appropriately.

In addition, the thermoplastic resin, such as the general-purpose polycarbonate which is engineering plastic, the polyamineimides which are super engineering plastic, polyphenylene sulfide, polyether sulfone, polyphenylene ether, polysulfone, tetrafluoroethylene.

Furthermore, in above thermoplastic resin and thermoset resin, a resin can be used which improves a heat resistance and dimensional stability for heat by using inorganic filler and a organic modified filler compound. Furthermore, resin with an added amine group, silicone group for cohesive improvement can be used.

In addition, a UV curable epoxy resin, acrylic acid resin, silicone resin, and epoxy resin having particularly high coherency under high temperature environment can be used.

Besides resin, metal or ceramic materials can be used as supporting parts 4, which can coat the surrounding of the structure 3 by metal such as Al, Cu, Ni, the Au, and the materials can be applied by either a dry method such as sputtering or a wet method such as plating.

In addition, cohesion will improve by using a metal which is easy to generally match with carbon or the alloys in which an ingredient is included such as Ti, Ni, NiCr or Pt as the undercoat.

The surrounding of the structure 3 can be coated by ceramic such as alumina, zirconia, silicon carbide, boron nitride, or nitride aluminum. A dry method can be used such as sputtering or hot press method after the ceramic is made in the form of a slurry, and coated the surrounding of the structure 3.

In addition, as mentioned above, graphite surface metallization can improve relief of the thermal stress and the adhesion.

If an impregnation process is performed which impregnates resin in structure 3 such as by vacuum impregnation method before a coating process and, the mechanical strength of the structure can improve. The resin used for impregnation is similar to the above, but it is preferable to use epoxy resins or phenolic resins in particular.

In addition, when a coating thickness on structure 3 shown in FIG. 2 is thin, a plurality of stacked structures 3 stacked initially along by stacking direction of graphite sheets and coated by support parts 4 as an unit the stacked many structures 3 will be able to produce an anisotropic thermal conduction element 1 having a large contact area for transmission of heat H.

As seen in FIG. 5(a), a polishing process step of polishing the surface of structure 3 can be performed after the cutting process surface gets smooth by polishing apparatus 30 and the surface becomes clean. A film forming process step forming metal layer M on the surface as mentioned in FIG. 5(b) can be carried out.

In the film forming process, titanium Ti first layer 5 as an active species is formed on the surface of the structure 3 and the supporting parts 4, and a nickel Ni layer or copper Cu second layer 6 is formed on the top, and gold Au third layer 7 can be formed on the second layer more. It is preferable for a film thickness of each metal layer to be around 0.3 μm.

As a film manufacturing method, either a wet method such as the plating method or a dry method such as sputtering and vapor deposition can be used.

Because soldering cannot connect the graphite structure 3 and heat source H directly, forming the metal layer M in a film process and soldering metal layer 5 to heat source H at the metal layer (M), so that structure 3 can be connected to heat source H strongly by soldering through such metal layer (M). In this case because a film thickness of metal layer M is around 1 μm, there is almost no reduction of thermal conduction.

In addition, when it is necessary to conduct thermal conduction and be in an electrically insulated state with respect to heat source H, an insulation film can be formed consisting of a ceramic easily by making a thermal ceramic spray comprising ceramics such as alumina, silundum, boron nitride, the nitriding aluminum on the surface of structure 3 after the polishing process.

The adhesion performance of the ceramic in the thermal spray process can be improved by applying a surface treatment which uses plasma or laser and activating the surface of structure 3 before the thermal spray process.

Depending on the application, it is possible to form a metal layer M and the ceramic layer in structure 3 on the front and back both sides of supporting parts 4. It is preferred to form the ceramic layer only for the surface of structure 3 which is opposes the heat source from the viewpoint of heat resistance of support part 4.

In other words, a surface treatment process by this invention is carried out by a coating process, or a polishing process and thermal spraying process or combinations of those processes.

Furthermore, it is possible to fix heat source H easily and strongly as seen in FIG. 5(c) without damaging structure 3 by forming screw hole 4a as an installation part or means to any heat source H or heatsink to support parts 4 which is a coating which can an encapsulation which at least partially surrounds structure 3.

In addition, structure 3 can adhere by adhesion by spreading an adhesive on a contact surface of structure 3 which contacts heat source H.

Figure 6:
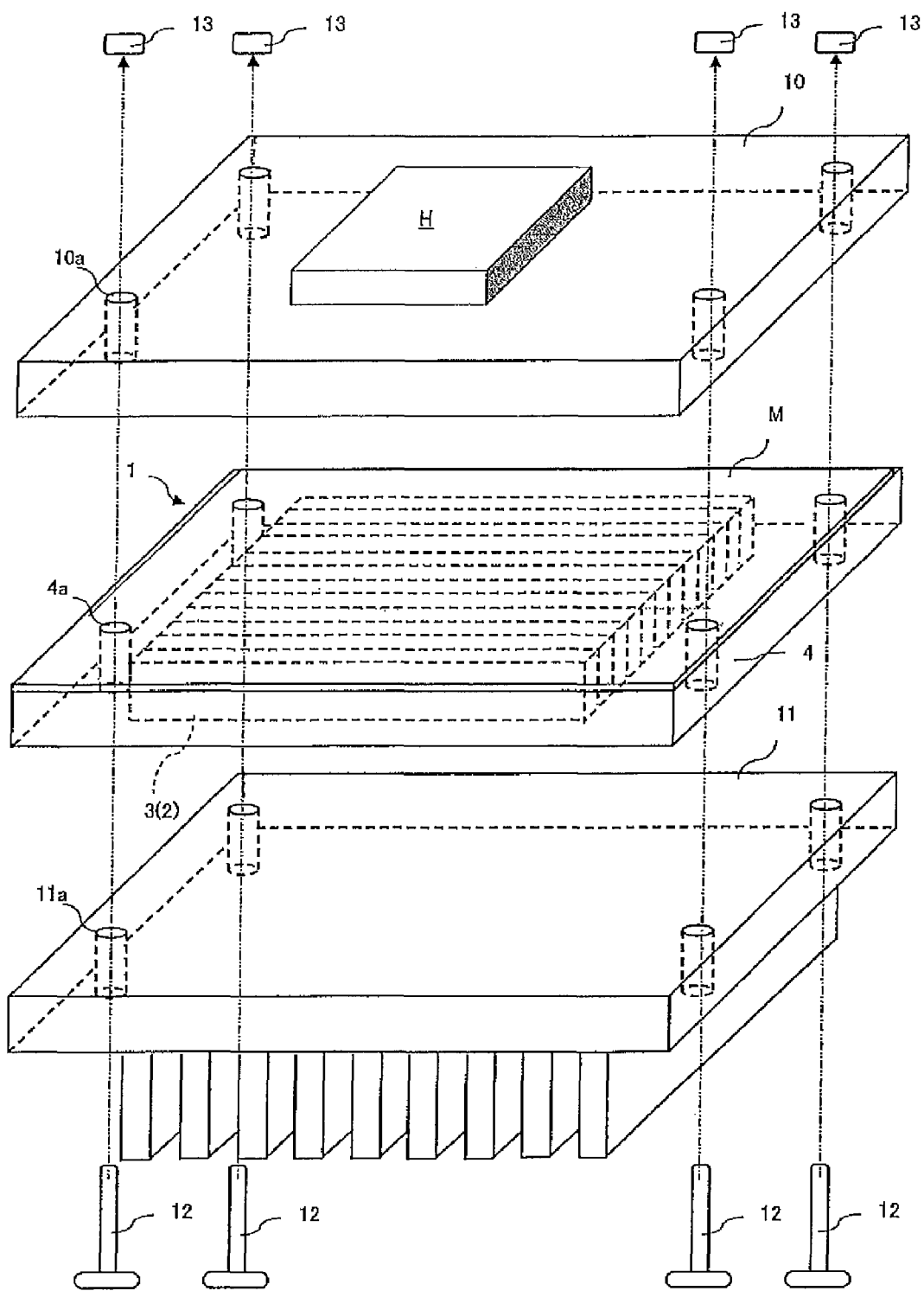
FIG. 6 is an exploded view of the an embodiment of the anisotropic thermal conduction element of the present invention.
Figure 7:
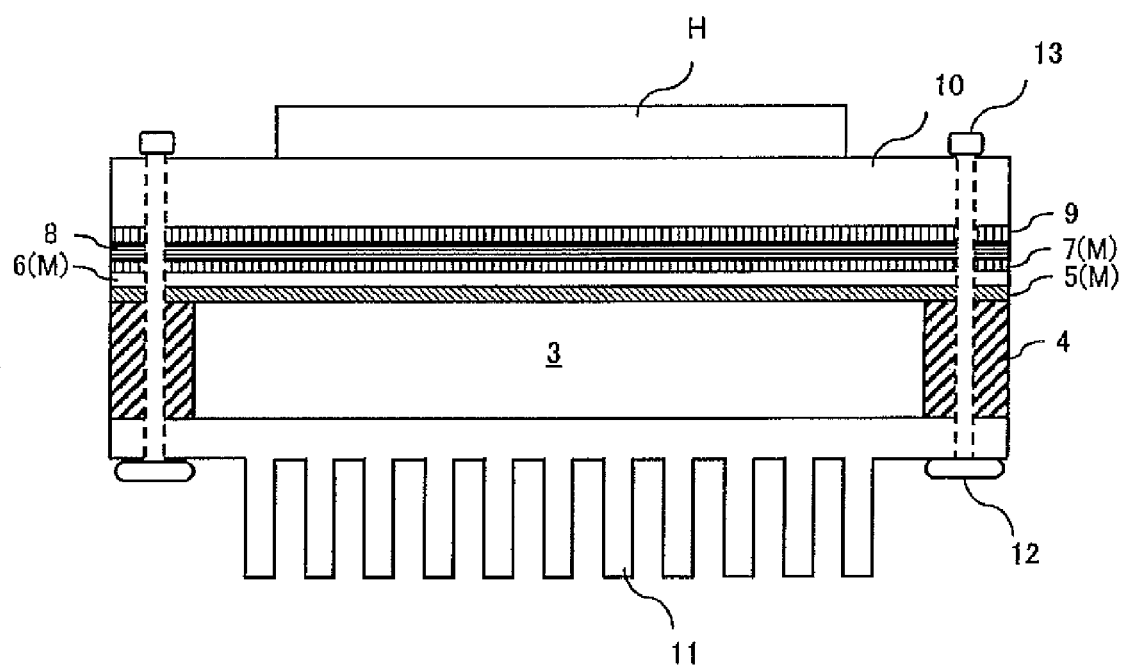
FIG. 7 shows a cross section of an embodiment of the anisotropic heat conduction element of the present invention.

FIGS. 6 and 7 show an example of an embodiment of the present invention for transmitting heat from a heat source H using an anisotropic thermal conduction element 1 produced as described above.

The thickness direction of structure 3 conducts beat through anisotropic thermal conduction element 1 from heat source H which adheres to or is connected to ceramic board 10. Heat is transmitted in this example to heat sink 11 arranged on the back of anisotropic thermal conduction element 1. Anisotropic thermal conduction element 1 is sandwiched between ceramic board 10 and heat sink 11, here a heat radiation fin, and ceramic board 10 and anisotropic thermal conduction element 1, anisotropic thermal conduction element 1 and heat sink 11 are in very close contact, and are fixed strongly by a fixing means, screw 12 and nut 13 through screw hole 10a, 4a, 11a formed in each.

In addition, in FIG. 7, reference numeral 8 identifies a solder layer, and reference numeral 9 refers to a metal layer which were formed on ceramic board 10.

It is suitable that a kind of highly oriented pyrolytic graphite is chosen as a structure 3 used for anisotropic thermal conduction element 1 as described above. It is possible to raise heat conduction efficiency drastically by using highly oriented pyrolytic graphite which has a thermal conductivity that is higher than normal graphite.

It is preferable to use highly oriented pyrolytic graphite having thermal conductivities more than 1,500 W/m degree K and a suitable example for use in particular is brand name PYROID® HT made by MINTEQ International Inc in New York, N.Y.

Generally, thermal conductivity is caused by the free electrons and the lattice vibration. The high thermal conductivity (1000-2000 W/m degree K) of diamond is caused by lattice vibration, while the thermal conductivity of the extremely anisotropic PYROID® HT graphite is equal to or less than diamond due to both free electron and the lattice vibration.

However, PYROID® HT pyrolytic graphite has many useful characteristics, such as the following: density 2.22 g/cc, tensile strength 28900 kPa (a direction), elastic modulus 50 GPa (a direction), flexural modulus 33200 MPa (a direction), coefficient of thermal expansion 0.6^10−6/degrees Celsius (a direction), 25^10−6/degrees Celsius (c direction), thermal conductivity 1,700 Watts/m degree K (a direction), 7 Watts/in degree K (c direction), 5.0^10−4 electric specific resistance Ωcm (a direction), 0.6 Ωcm (c direction), oxidation threshold 650 degrees Celsius (a direction), and permeability 10−6 mmHg.

The thermal conductivity of PYROID® HT pyrolytic graphite in the a direction of compared with other materials thermal conductivity is extremely high, for example about 6 times the values of aluminum nitride (AlN) and the beryllia (BeO), and about 4 times the value of the overall thermal diffusion of the material copper (Cu) in particular.

In addition, the a direction is the laminating direction within a plane direction of graphite sheets, the c direction is perpendicular to the a direction.

The density of PYROID® HT pyrolytic graphite is almost the theoretical density 2.3 g/cc of the graphite, and the elastic modulus 50 GPa (a direction) is high so it is easy to break when stressed such as during mechanical vibration, and processing is not easy, but is possible to maintain expected heat conduction performance without breaking at the time of the processing, due to stress of the machine at the time of the installation to the heat source and the vibration of the machine after the installation because support by support parts 4 in the form of a coating is formed on at least a part of the surrounding of structure 3 as stated above.

Figure 8:
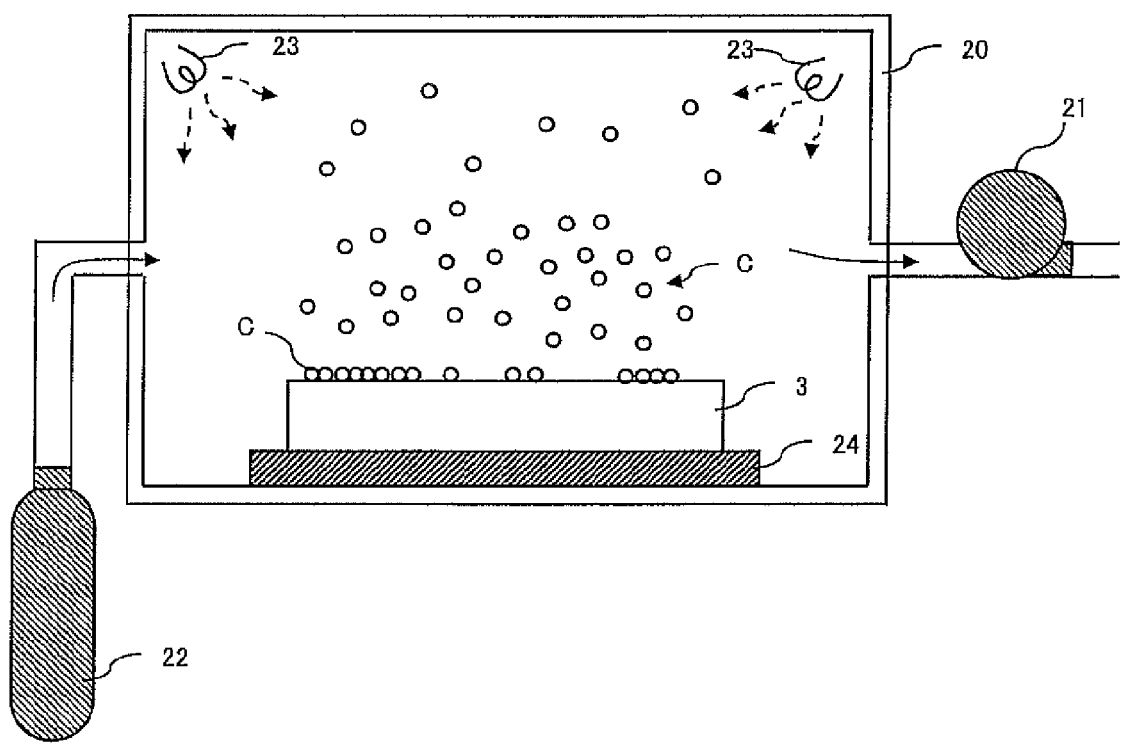
FIG. 8 shows a manufacturing method of highly oriented pyrolytic graphite for an anisotropic thermal conduction element by this invention.

PYROID® HT pyrolytic graphite is produced by the CVD method as shown in FIG. 8. In chamber 20 under vacuum by a vacuum pump 21, hydrocarbon gas supplied from cylinder 22 as raw material gas is decomposed by heat by the gas being heated to more than 2,000 degrees Celsius by heater 23, and while minute carbon nucleus C which deposit and crystallize on substrate 24, stack and deposit in stratified formation, and PYROID® HT pyrolytic graphite is produced.

PYROID® HT pyrolytic graphite is available in thicknesses of from 0.25 mm to 20 mm, and can be produce as a board of a variety of sizes as large as 300 mm square shaped structure by controlling stacking, deposit time.

An anisotropic thermal conduction element 1 as described above transmits heat from a heat source H. Electronic devices such as a semiconductor integrated circuit, a power semiconductor, a semiconductor laser, and an electronic device which includes an anisotropic thermal conduction element 1 with such a heat source H can be utilized in many areas.

It can be used in particular in applications demanding vibration-resistance when used in anything automotive which have undergone remarkable electronic advancement in recent years.

Accordingly, it is understood that the above description of the present invention is susceptible to considerable modifications, changes and adaptations by those skilled in the art, and that such modifications, changes and adaptations are intended to be considered within the scope of the present invention, which is set forth by the appended claims.

We claim:

1. An anisotropic thermal conduction element for conducting heat from a heat source comprising:
    a stack of pyrolytic graphite sheets, each of the pyrolytic graphite sheets in the form of a plane and having a high thermal conductivity in the direction of the plane formed by each pyrolytic graphite sheet and, a low thermal conductivity in the thickness direction of each pyrolytic graphite sheet, the pyrolytic graphite sheets having a contact surface for contacting the heat source across the thickness direction of the graphite sheets wherein the stack of pyrolytic graphite sheets are at least partially coated by a resin thus forming a support part of the anisotropic thermal conduction element.

2. The anisotropic thermal conduction element of claim 1 wherein a metal layer is formed where the pyrolytic graphite sheets contact the heat source.

3. The anisotropic thermal conduction element of claim 1 wherein a ceramic layer is formed where the pyrolytic graphite sheets contact the heat source.

4. The anisotropic thermal conduction element of any one of claims 1 to 3 wherein the anisotropic thermal conduction element is impregnated with resin.

5. The anisotropic thermal conduction element of any one of claims 1 to 3 wherein the graphite sheets are highly oriented pyrolytic graphite having a thermal conductivity of more than 1,500W/mK.

6. The anisotropic thermal conduction element of any one of claims 1 to 3 further comprising an installation part for fixing the heat source to the support part.

7. The anisotropic thermal conduction element of any one of claims 1 to 3 in combination with an electronic device wherein the electronic device has a heat source and the anisotropic thermal conduction element conducts heat from the heat source.

8. A method of manufacturing the anisotropic thermal conduction element of claim 1 comprising the steps of:
    providing a first stack of pyrolytic graphite sheets such that each of the pyrolytic graphite sheets is in the form of a plane and has a high thermal conductivity in the direction of the plane formed by each pyrolytic graphite sheet and a low thermal conductivity in the thickness direction of each pyrolytic graphite sheet;
    coating the first stack of pyrolytic graphite sheets at least partially with a resin to form a coating on the first stack of pyrolytic graphite sheets;
    cutting the first stack of pyrolytic graphite sheets across the thickness direction of the pyrolytic graphite sheets to form a second stack of pyrolytic graphite sheets having the coating on at least a portion of the second stack of pyrolytic graphite sheets, the coating forming a support part of the anisotropic thermal conduction element thus formed and the second stack having a contact surface for contacting the heat source across the thickness direction of the pyrolytic graphite sheets.

9. A method of manufacturing the anisotropic thermal conduction element of claim 1 comprising the steps of:
    providing the stack of pyrolytic graphite sheets such that each of the pyrolytic graphite sheets is in the form of a plane and has a high thermal conductivity in the direction of the plane formed by each pyrolytic graphite sheet and a low thermal conductivity in the thickness direction of each pyrolytic graphite sheet;
    providing a contact surface on the pyrolytic graphite sheets for contacting the heat source across the thickness direction of the pyrolytic graphite sheets; and
    coating the pyrolytic graphite sheets at least partially with a resin thus forming a support part of the anisotropic thermal conduction element.

10. The method of manufacturing the anisotropic thermal conduction element of claim 9 further comprising the step of surface treating at least a portion of the contact surface of the stack of pyrolytic graphite sheets.

11. The method of manufacturing the anisotropic thermal conduction element of claim 9 further comprising the step of impregnated resin in the stack of pyrolytic graphite sheets before coating the graphite sheets.

* * * * *